Nov. 4, 1958 D. P. KENNEDY 2,859,286

VARIABLE GAIN DEVICES

Filed Nov. 12, 1953

INVENTOR
DAVID P. KENNEDY
BY Elmer J. Gorn
ATTORNEY

United States Patent Office 2,859,286

Patented Nov. 4, 1958

2,859,286

VARIABLE GAIN DEVICES

David P. Kennedy, Cambridge, Mass., assignor to Raytheon Manufacturing Company, Waltham, Mass., a corporation of Delaware Application November 12, 1953, Serial No. 391,633

2 Claims. (Cl. 179—171)

This invention relates to a variable gain device and more particularly to a system wherein a dual collector transistor is used and in which the gain of the transistor is proportional to and controlled by the voltage applied to a second collector.

In radio receivers using vacuum tubes, a direct current voltage is usually taken from the output of a diode detector and fed back to the amplifier grid circuits in such a manner that an increase in carrier level will cause a proportional decrease in amplifier gain. It can be shown that a feedback circuit of this type will keep the diode detector output relatively constant for a large change in carrier level at the input to the receiver, and is commonly called an automatic gain or volume control system.

The characteristic of a vacuum tube which makes feedback systems practical is the decrease in the mutual conductance of the tube with an increase in bias voltage. The remote cut-off pentode, which is often used in intermediate frequency amplifiers, was designed to accentuate the variable conductance characteristic. However, transistors do not offer a variable gain by a change in the quiescent point of operation because their gain remains relatively constant to cut-off. This has introduced limitations in the design of audio and intermediate frequency amplifier systems, oscillators, gating circuits and other circuits utilizing the feedback principle wherein it is desired to employ transistors.

This invention involves a means for controlling the transistor gain in an electrical system wherein a biasing voltage applied to a second collector of the transistor is the means employed. This means can be used on both point contact and junction type transistors. Thus, if the added or second collector is positioned adjacent to and slightly separated from the first collector and is biased with the same polarity with respect to the emitter as the first collector, it will set up a small potential gradient in the base region of the transistor and some of the carriers will be collected away from the first collector. The number of carriers that the second collector receives is proportional to the voltage applied thereto. If this approach is used in a grounded emitter junction transistor amplifier, for example, the characteristics of the transistor are such that it will have a gain of approximately forty when the second collector is inoperative, but this gain is decreased to approximately twenty when the additional collector is biased to attract approximately two percent of the carriers away from the first collector. In the case of a grounded base point contact transistor amplifier, it would be necessary to take away approximately fifty percent of the carriers with this second collector for an equivalent reduction in gain to be obtained. Thus, it may be seen that the dual collector transistor can be advantageously used wherever it is desired to control the gain of the transistor by an application of a biasing voltage to the second collector electrode.

This application and the features thereof will be understood more clearly and fully from the following detailed description of one embodiment of the invention with reference to the accompanying drawing wherein.

Figure 1:
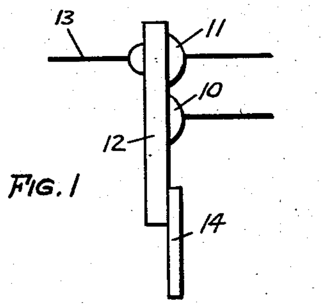
Fig. 1 is a diffused junction type transistor having a second collector connected thereto.
Figure 2:
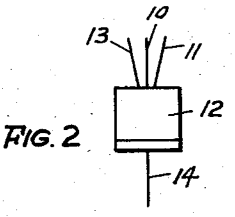
Fig. 2 is a point contact type transistor having a second collector connected thereto.

Referring now to Figs. 1 and 2, a junction type and a point contact type transistor, which can be utilized in accordance with this invention, are shown. These transistors are in all respects similar to those well known in the art with the exception that a second collector 10, in each of these transistors, has been connected thereto. In the junction type transistor shown in Fig. 1, the second collector 10 can be a partially diffused bead of indium, a p-type material, as is the first collector 11. The semiconductor crystal chip 12 can be an n-type germanium single crystal, for example, and the emitter 13 can also be an indium bead which has been partially diffused into the chip. For the base connection, a nickel tab 14 can be joined to the chip, and a suitable lead wire can then be attached to each of the indium beads, as shown, to complete the basic transistor assembly. It should be noted that the location of the second collector 10 is not critical, but the number of carriers which it will collect away from the first collector 11 is substantially proportional to the distance at which it is removed from the first collector and from the emitter 13. Therefore, it is desirable to position the collectors 10 and 11 only slightly apart and they should be substantially opposed to the emitter 13 to most effectively change the transistor gain.

Likewise, the point contact type transistor shown in Fig. 2 has a second collector 10 which is only slightly separated from the first collector 11 and the emitter 13. The emitter and two collectors are point contact wires held on the face of the semiconductor chip 12 in ways well known in the art. The chip 12 can be n-type single crystal germanium, for example, and a base connection 14 is made to a face thereof opposite to that on which the emitter and collector electrodes are disposed. It should be noted that for both junction and point contact type transistors, the relative positions of the semiconductor material and the n-type and p-type impurity elements associated therewith can be varied to form NPN or PNP type transistors suitable for use in accordance with this invention if the basic characteristics of the transistor relating to proper biasing and the proper positioning principles heretofore described relating to the second collector 11 are kept in mind.

Figure 3:
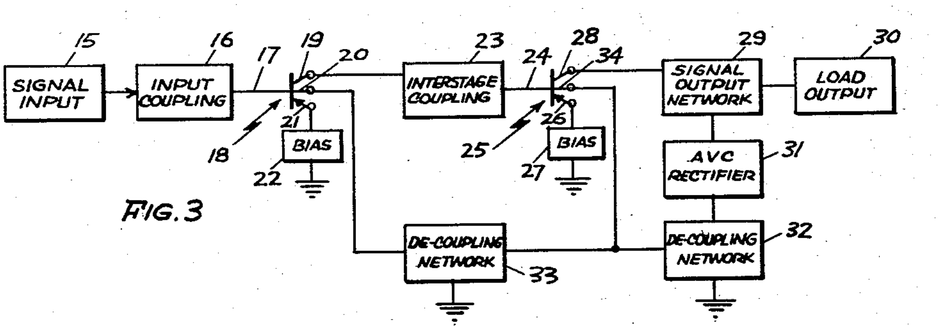
Fig. 3 is a block circuit diagram illustrating the use of dual collector transistor amplifiers employing an automatic volume control system.
Figure 4:
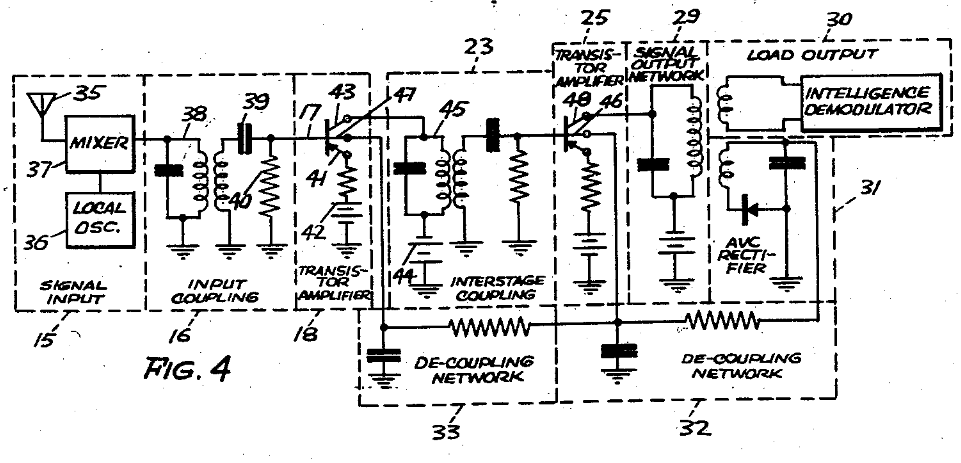
Fig. 4 illustrates a specific embodiment of the circuit shown in Fig. 3.

The use of the second collector is exemplified broadly in Fig. 3 as it could be used in an intermediate frequency or audio frequency amplifier circuit having an automatic volume control, and a specific embodiment utilizing the second collector is illustrated in Fig. 4 as it could be used in an intermediate frequency amplifier. Referring now to Fig. 3 a signal input stage 15 is used to pass a signal through a suitable input coupling system 16 to the base connection 17 of a transistor amplifier 18 having first and second collectors 19 and 20, respectively, and an emitter 21. Although, in this example, the emitter 21 is grounded through a suitable biasing source 22, it should be understood that a grounded base transistor amplifier circuit could also be used. Likewise, the transistor employed can be the point contact type or junction type.

The amplified signal is then sent from the first collector 19 to an interstage coupling network 23 which is joined to the base connection 24 of the second transistor amplifier 25. As in the first amplifier, the emitter 26 of this amplifier is also grounded through a biasing source 27. Thus, the signal is amplified a second time and passed from the first collector 28 of the amplifier 25 to a signal output network 29. A portion of the signal is sent to the load output circuit 30 and the remainder of the signal is fed back through an automatic volume control rectifier 31 and a pair of decoupling networks 32 and 33 to the second collectors 34 and 20 of the amplifiers 18 and 25, respectively. Thus, the second collectors are biased with the same polarity as are the first collectors 19 and 28 and will remove a number of carriers which would otherwise reach the first collectors. Since the number of carriers removed by these second collectors is proportional to the signal input to the amplifiers 18 and 25, the output of these amplifiers will remain substantially constant with changes in carrier level and the signal passed on to the load output 30 will reman steady in accordance with automatic volume control principles.

With reference now to Fig. 4, an intermediate frequency transistor amplifier having an automatic volume control will be described as a specific means of using the second collector to control transistor gain. The dotted sections shown in Fig. 4 correspond to the blocks in the circuit diagram shown in Fig. 3, and it may be seen that the broad exemplification of the invention described above can be correlated to this particular embodiment. Thus, the dual collector transistors 18 and 25 are of the p–n–p junction type and are employed as grounded emitter transistor amplifiers. Thus, the signal input stage 15 of the receiver comprises an antenna 35, a local oscillator 36 and a mixer 37. The input coupling stage 16 consists of a tuned circuit 38 which is inductively coupled to a condenser 39 and thence to the base lead 17 of the transistor amplifier 18. A biasing resistor 40 is used to control the signal input to the transistor amplifier. As previously mentioned, this amplifier is a p–n–p type junction transistor; therefore, the emitter 41 should be biased positively with a suitable battery 42 in accordance with transistor principles well known in the art. Likewise, the first collector 43 should be biased negatively with a battery 44 which is connected through the tuned circuit 45 to this collector, as can be seen in the interstage coupling circuit 23. The interstage coupling circuit 23 passes an amplified signal onto the second transistor amplifier 25 wherein the signal is again increased and sent to the signal output network 29. The second transistor amplifier 25 is biased in the same manner as is the first amplifier. A portion of the amplified signal is passed on to the load output circuit 30 from the signal output network 29 and thence to the next stage of the receiver, not shown. However, a second portion of this signal is fed through an A. V. C. rectifier circuit 31 to two decoupling networks 32 and 33 which are respectively connected to the second collectors 46 and 47 of the transistor amplifiers 18 and 25.

From the above, it may be seen that the second collectors 46 and 47 are biased with the same polarity as are the first collectors 43 and 48 of the transistor amplifiers, and in each of these amplifiers a small potential gradient is set up in the base regions thereof. Therefore, some of the carriers are taken away from the first collectors 43 and 48, and, since the biasing voltage on these second collectors is proportional to the carrier level, the number of carriers that these second collectors remove is also proportional to the carrier level. Thus, as the carrier level increases or decreases, the output from the first collectors 43 and 48 will remain substantially constant and the output of the amplifier stages will be stable. As previously mentioned above, the current amplification characteristics of the grounded emitter junction type transistor amplifier are such that, if the second collector is biased to attract about two percent of the carriers away from the first collector, the current gain of the amplifier is decreased by approximately fifty percent.

However, it should be understood that this invention is not limited to the particular details described above as many equivalents will suggest themselves to those skilled in the art. For example, the transistor used as an amplifier in the circuits described above can be a junction type or a point contact type, and the doping elements which determine the conductivity types of the areas within the semiconductor crystal chip can be varied as desired in accordance with transistor principles well known in the art. Likewise, the circuitry shown should not be limited to transistor amplifiers because the dual collector transistor described herein is applicable to any circuit utilizing feedback biasing principles. Therefore, it is desired that the appended claims be given a broad interpretation commensurate with the scope of the invention within the art.

What is claimed is:

1. An automatic gain control system comprising a body of semiconductive material including areas of opposite conductivity type, means for establishing electrical connections to said areas, said means including an emitter connection to an area of a first conductivity type and first and second collector connections to other separated areas of said first conductivity type, a base connection to an area of second conductivity type, means for biasing said emitter connection, a signal input circuit coupled to said emitter connection, means for biasing said collectors in the reverse direction, a signal output circuit coupled to one of said collector connections, means for rectifying a portion of the output signal from said one collector connection, and a decoupling network connected directly between said rectifying means and the other of said collector connections for applying said rectified portion of said signal directly to said other collector connection whereby the gain of said system may be automatically controlled.

2. An automatic gain control system comprising a body of semiconductive material including areas of opposite conductivity type, means for establishing electrical connections to said areas, said means including an emitter connection to an area of a first conductivity type, first and second collector connections to other separated areas of said first conductivity type, a base connection to an area of second conductivity type, means for biasing said emitter connection, means for reversely biasing said first collector connection, means electrically coupled to said first collector connection for rectifying a portion of a signal voltage emanating from said first collector, said signal voltage being proportional to a signal input to the system and of the same polarity with respect to said emitter connection as said first collector connection, and a decoupling network connected directly between said rectifying means and said second collector connection for applying said rectified portion of said output signal to said second collector connection whereby the gain of said system remains substantially constant during operation.

References Cited in the file of this patent

UNITED STATES PATENTS

| | | |
|---|---|---|
| 2,185,612 | Trevor | Jan. 7, 1940 |
| 2,655,607 | Reeves | Oct. 13, 1953 |
| 2,666,150 | Blakely | Jan. 12, 1954 |
| 2,701,281 | White et al. | Feb. 1, 1955 |
| 2,709,787 | Kircher | May 31, 1955 |
| 2,734,102 | Pankove | Feb. 7, 1956 |
| 2,751,446 | Bopp | June 19, 1956 |

FOREIGN PATENTS

| | | |
|---|---|---|
| 679,674 | Great Britain | Sept. 24, 1952 |

OTHER REFERENCES

Bell text "The Transistor," pages 402, 409, pub. 1951 by Bell Tel. Labs., Inc., Murray Hill, N. J. Copy in Cl. Div. II.